US007844926B1

(12) United States Patent
Russell

(10) Patent No.: US 7,844,926 B1
(45) Date of Patent: Nov. 30, 2010

(54) SPECIFICATION WINDOW VIOLATION IDENTIFICATION WITH APPLICATION IN SEMICONDUCTOR DEVICE DESIGN

(75) Inventor: Edmund L. Russell, Danville, CA (US)

(73) Assignee: Oracle America, Inc., Redwood City, CA (US)

( * ) Notice: Subject to any disclaimer, the term of this patent is extended or adjusted under 35 U.S.C. 154(b) by 518 days.

(21) Appl. No.: 11/345,554

(22) Filed: Jan. 31, 2006

(51) Int. Cl.
*G06F 17/50* (2006.01)
*G06F 17/10* (2006.01)
*G06F 7/60* (2006.01)

(52) U.S. Cl. .................................. 716/4; 716/5; 703/2
(58) Field of Classification Search ..................... 716/4, 716/5; 703/2
See application file for complete search history.

(56) References Cited

U.S. PATENT DOCUMENTS

| | | | |
|---|---|---|---|
| 5,548,539 A * | 8/1996 | Vlach et al. ..................... | 703/6 |
| 5,903,523 A * | 5/1999 | Peck ........................... | 368/202 |
| 6,018,623 A * | 1/2000 | Chang et al. ................... | 716/6 |
| 6,356,861 B1 * | 3/2002 | Singhal et al. ................. | 703/2 |
| 6,366,822 B1 * | 4/2002 | Heavlin ....................... | 700/31 |
| 6,708,073 B1 * | 3/2004 | Heavlin ....................... | 700/121 |
| 6,951,001 B2 * | 9/2005 | Chen ........................... | 716/5 |
| 6,993,735 B2 * | 1/2006 | Liau ............................ | 716/4 |
| 7,016,819 B1 * | 3/2006 | Lui ............................. | 703/2 |
| 7,480,603 B1 * | 1/2009 | San et al. ..................... | 703/13 |
| 2002/0035454 A1 * | 3/2002 | Ingram et al. ................... | 703/2 |
| 2003/0065476 A1 * | 4/2003 | Schmidt et al. ............... | 702/179 |
| 2004/0034838 A1 * | 2/2004 | Liau ............................ | 716/4 |
| 2004/0135903 A1 * | 7/2004 | Brooks et al. ............ | 348/231.99 |
| 2005/0024651 A1 * | 2/2005 | Yu et al. ........................ | 358/1.9 |
| 2005/0084907 A1 * | 4/2005 | Fox ............................ | 435/7.1 |
| 2005/0251373 A1 * | 11/2005 | Daems et al. .................. | 703/2 |
| 2008/0234974 A1 * | 9/2008 | Alderman .................... | 702/179 |
| 2009/0299638 A1 * | 12/2009 | Saltzer et al. ................. | 702/14 |

OTHER PUBLICATIONS

Manteufel, R., "Evaluating the Convergence of Latin Hypercube Sampling", Apr. 2000, 41st AIAA/ASME/ASCE/AHS/ASC Structures, Structural Dynamics, and Materials Conference and Exhibit, pp. 1-7.*

* cited by examiner

*Primary Examiner*—Vuthe Siek
*Assistant Examiner*—Patrick Sandoval
(74) *Attorney, Agent, or Firm*—Martine Penilla & Gencarella, LLP

(57) ABSTRACT

A method for identifying specification window violations for a system is described. The method includes generating a sample set of input parameters. The system is simulated using the sample set to generate an output set. A mathematical model is best-fit to the output set. A set of desirability functions is defined to an out-of-spec condition. The model is then searched using the desirability functions to identify a worst-case data point. The worst-case data point can then be determined as either being within specification or out of specification.

12 Claims, 6 Drawing Sheets

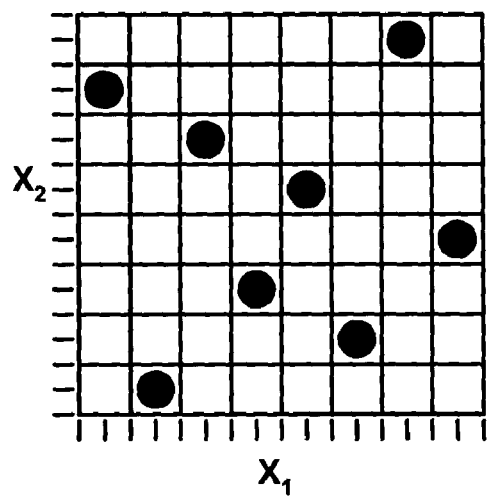 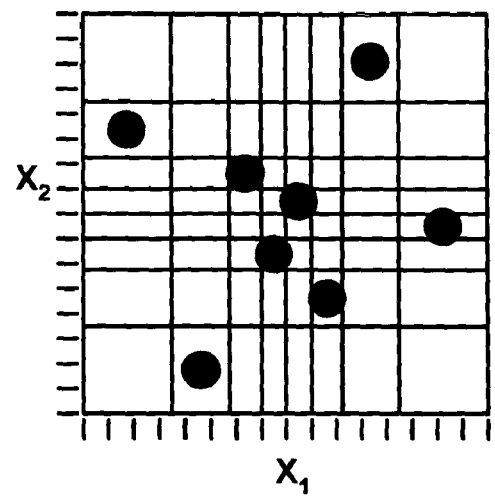
FIG. 2A  FIG. 2B
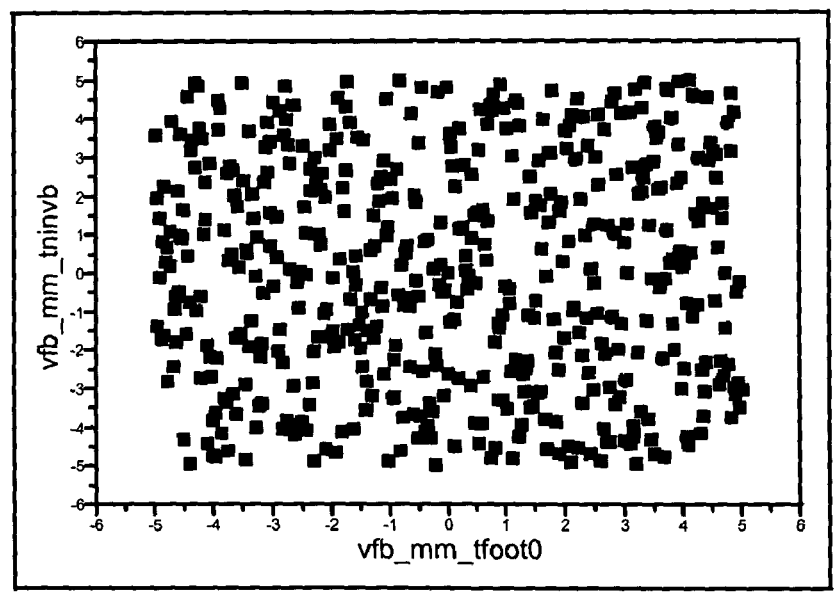
FIG. 3

SPECIFICATION WINDOW VIOLATION IDENTIFICATION WITH APPLICATION IN SEMICONDUCTOR DEVICE DESIGN

BACKGROUND

Semiconductor devices are designed using what is known as simulation program with integrated circuits emphasis (SPICE) simulations. SPICE is a powerful computer program available under open source license as well as from a variety of commercial vendors. SPICE is typically used in integrated circuit (IC) and board level design to check the integrity of circuit designs and to predict circuit behavior. Given a particular design and values of a plurality of input parameters affecting the design and/or process, SPICE can accurately predict whether the resulting device will conform to a defined specification window, i.e., behave in an intended manner. Process variations in IC manufacturing include variations in fabrication as well as operational variations, such as flat-band voltage, oxide thickness, temperature, and stress.

Typical methodologies to determine if a device works over a technology window involve Monte Carlo simulations and corner run analysis for specific corners of the technology. Monte Carlo methods are a class of computational algorithms for simulating the behavior of various physical and mathematical systems, typically in a nondeterministic manner, e.g., by using random or pseudo-random numbers. Neither Monte Carlo nor corner run analyses can efficiently and economically assess performance of a device design to the technology window when the number of corners is large, e.g., thousands to millions of corners. A particular design having n process variables will have $2^n$ corners. Each corner is a region of multi-dimensional space where all n process variables are at the extreme ends of their acceptable input range. Faces of the process space occur when some of the variables are at extreme ends of their acceptable input ranges and others are not.

It can be very difficult for design engineers to predict the reliability of a design, even when all the process variables are within the design tolerance. Generally, when a design fails despite being within design tolerances, it is because a combination of process variables are at an extreme of a permitted range, i.e., the process variables are at a corner or a face of the design space. Unfortunately, even with thousands SPICE runs, it is impossible to test, by simulation, all the corners to appropriately characterize the failure modes of the design. For example, with only 40 process variables, there are $2^{40}$, or over a trillion corners. Furthermore, traditional methodology dictates that process variables be randomly selected with a distribution consistent with actual production or operation, typically a normal (bell curve) distribution. While this methodology is useful in predicting yield during an actual production run, it does not assist the designers in identifying specific areas of the design that contribute to the failure rate. This is because the normal distribution is center-weighted, which is not generally helpful in identifying failures. Typically, few if any of the simulations will occur near an actual design process face or corner even when millions of simulations are performed.

Therefore, there exists a need in the industry for a new methodology that will aid designers in identifying specific regions of the design space prone to failure, thereby enabling more reliable designs, higher yield rates, and lower overall cost.

SUMMARY

Broadly speaking, the present invention fills these needs by identifying specification window violations.

It should be appreciated that the present invention can be implemented in numerous ways, including as a process, an apparatus, a system, a device, or a method. Several inventive embodiments of the present invention are described below.

In one embodiment, a method for identifying specification window violations for a system is provided. The method includes generating a sample set of input parameters. The system is simulated using the sample set to generate an output set. A mathematical model is best-fit to the output set. A set of desirability functions is defined to an out-of-spec condition. The model is then searched using the desirability functions to identify a worst-case data point. The worst-case data point can then be determined as either being within specification or out of specification.

In another embodiment, a method for analyzing a design for an integrated circuit to identify violations of a specification window is provided. The method includes generating a SPICE deck and a pseudo-random sample set of input conditions. A series of SPICE runs is performed on the sample set of input conditions, the SPICE runs simulating the design to produce an output set of responses. A mathematical model is then fit to the output set. A set of desirability functions are set to an out-of-spec condition. The model is then searched using the desirability functions to identify a worst-case data point for the out-of-spec condition. A determination is then made as to whether the worst-case data point is within the specification window or out of the specification window.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A shows a Latin hypercube sample (denoted LHS) using uniform factors for two variables.

FIG. 2B shows the same sample as FIG. 2A, but with factors being defined with a normal distribution.

FIG. 3 shows a sample scatterplot of two input variables randomly selected using LHS with uniform factors.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

It will be noted that the specification window violation methodology presented herein may be performed with the assistance of a computer, such that some or all the operations may be automated. However, the statistical analysis methodology presented herein is primarily a tool for assisting a human understanding of specific phenomena. As such, human interaction and decision making will ordinarily be a part of the overall process. In one embodiment, the procedure is carried out with the aid of statistical analysis software known as JMP, a software package available from SAS Institute, Inc., located in Cary, N.C. While the system and procedures described herein are particularly directed to integrated circuit (IC) design and manufacture, they can easily be adapted for other complex systems.

Figure 1:
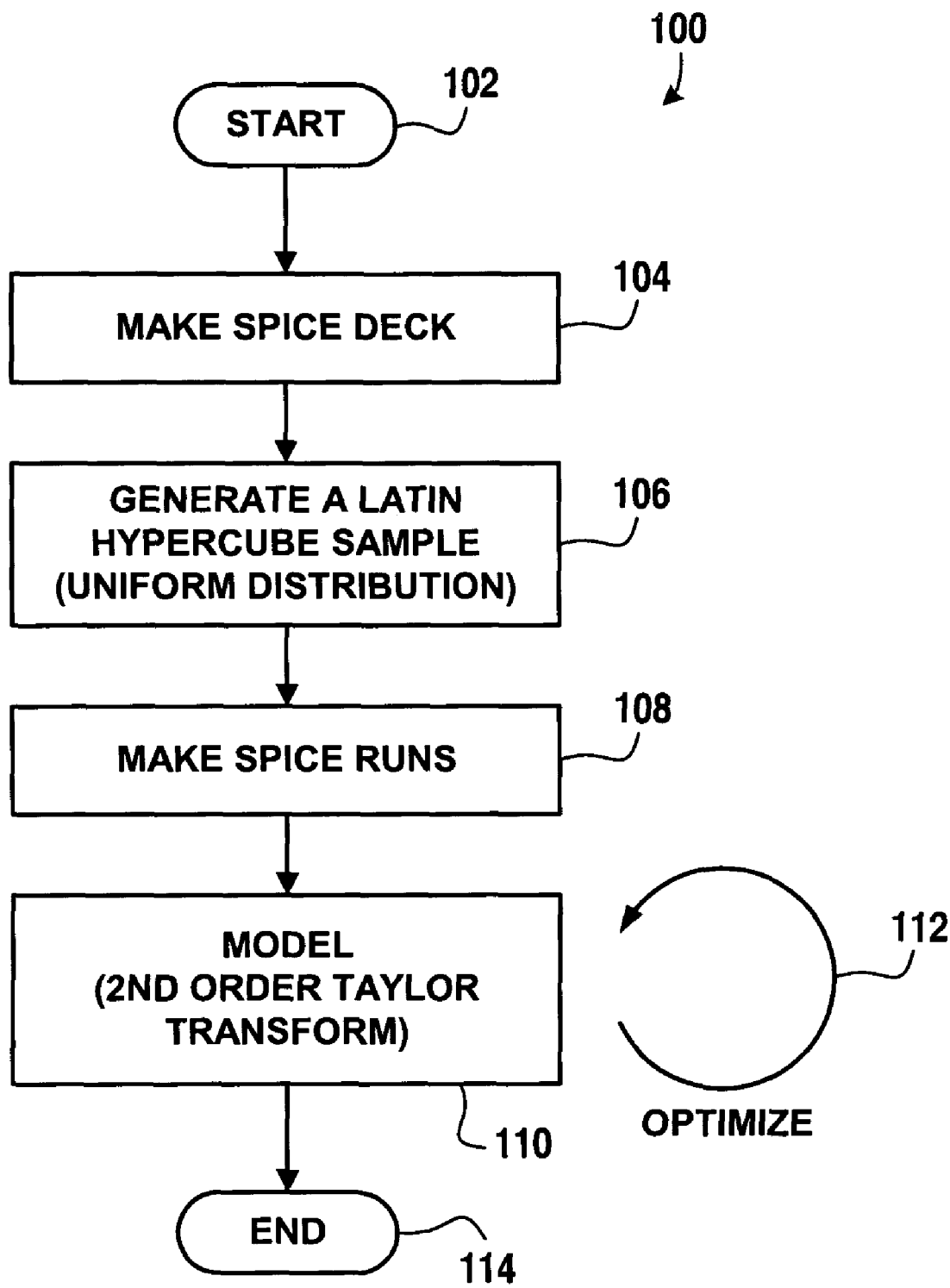
FIG. 1 shows a flowchart 100 presenting an overview of a procedure for identifying specification window violations for a particular semiconductor design.

FIG. 1 shows a flowchart 100 presenting an overview of a procedure for identifying specification window violations for a particular IC design. The procedure begins as indicated by start block 102 and proceeds to operation 104 wherein a spice deck is built. A spice deck is a description of the logic being modeled, in a format readable as input by a SPICE program. Typically, the spice deck is a text file. The process of generating a spice deck, which may be fully or partially automated, is well known among those skilled in the art. After building the spice deck, the procedure flows to operation 106.

In operation 106, a Latin hypercube sample with uniform factors is generated to provide inputs to the SPICE model. Latin hypercube sampling (LHS) is a pseudo-random sampling technique developed in 1981 for ensuring a distribution of samples across all dimensions. LHS is illustrated in FIGS. 2A and 2B. FIG. 2A shows an LHS sample using uniform factors for two variables $x_1$ and $x_2$. In an LHS, all of the variables are divided into an equal number of divisions, and data points are randomly selected so that only one data point occupies each division for each variable. Typically, the random selection is also made such that the data points are relatively equally distributed, e.g., to prevent trending. In one embodiment, each input variable is sampled within the design specification (within allowable tolerances) only. This allows the design to be tested for reliability across the design tolerances, and identify input conditions that generate failures. In another embodiment, input variables are sampled slightly beyond the design tolerances. While this generates a larger sample surface for modeling, thereby requiring less extrapolation, it should be noted that failures resulting from being outside the design tolerance do not reflect on the reliability of the design. Furthermore, Showing correct performance outside of the designed input space demonstrates robust design margin, a desired property which potentially indicates higher yield.

Traditionally, LHS sampling is taken with factors being defined with a normal distribution or other presumed central distribution which occurs in manufacturing, such as shown in FIG. 2B. This causes a majority of the data points to be grouped toward the center of the plot, and more accurately reflects actual production or operational variations. However, in operation 106, uniform factors are taken, which means uniform divisions for each variable when selecting the row and column sizes for LHS sampling. FIG. 2A shows the same LHS sample pattern as that of FIG. 2B, but with uniform divisions. The input parameters x1 and x2 are uniformly distributed in FIG. 2A. This ensures better sampling in the corners of the design. FIG. 3 shows a sample scatterplot of two input variables randomly selected using LHS with uniform factors. The uniform LHS technique significantly increases the coverage and can reduce the number of samples necessary to reach three standard deviations from mean by a factor of 100. Once the data points are selected, the procedure flows to operation 108.

Figure 4:
FIG. 4 shows an example of a three-dimensional scatterplot of inputs, wherein inputs corresponding to an out-of-spec output are shown as filled in blocks.

In operation 108, the SPICE runs are performed on the input samples. The SPICE simulation is run once for each data point selected in operation 106, generating an output set comprising series of data points in a result space. Each output variable is a characteristic of the IC or system being analyzed. To be within specification, a particular output value must be within a predefined specification window. If the output variable is outside of this specification window, then input conditions are flagged as generating a failure. Since the system is modeled in a computer using SPICE, there is no real-world randomness introduced into the system and therefore a particular set of inputs will always yield the same output. In one embodiment, a scatterplot is generated showing failing inputs highlighted in a different color, such as red. FIG. 4 shows an example of a three-dimensional scatterplot of inputs, wherein inputs corresponding to an out-of-spec output are shown as filled in blocks. After the SPICE runs are performed, the procedure flows to operation 110.

In operation 110, a mathematical model is generated that correlates the outputs to the inputs. In one embodiment, the mathematical model is a second-order Taylor series expansion for each output that describes a particular output. Equation 1 is an example of such mathematical model.

$$Y=\beta_0+\beta_1 X_1+\beta_2 X_2+\beta_{12} X_1 X_2+\beta_{11} X_1^2+\beta_{22} X_2^2+\beta_3 X_3 \quad [\text{Eq. 1}]$$

In Equation 1, the Xs each represent an input parameter, and the Y represents an output response. The model may take into consideration any number of variables consistent with the SPICE model. The number of parameters (and therefore terms in Equation 1) will vary considerably with the complexity of the system being modeled. For a reasonably complex IC, 300 or more parameters may be input into the model. A sensitivity can be determined by taking the derivative of Equation 1 at a particular point in the sample space. As is generally known in the art, the model may require a plurality of optimization iterations 112 to arrive at an acceptable model. Typically, the optimizations require that the residuals be analyzed, the residuals identifying areas where the model does not fit the SPICE data. Typically, a second order Taylor series expansion is sufficient. However, if necessary, the space can be partitioned. For example, if a crease or other nonlinear feature appears in the SPICE data that cannot be adequately modeled, the space can be partitioned so that each partition is independently modeled.

In general, when fitting a model to be used for interpolation, it is often reasonable to work with what is known as a "full model." In a full model, all the terms are retained regardless of their statistical significance. Terms that are not statistically significant generally have coefficients that are close to zero. When building a model for extrapolation or prediction, however, terms that are not statistically significant may be dropped. In one embodiment, a least significant term is dropped and the model re-fitted before dropping additional terms. Terms may continue to be dropped in this manner until only significant terms remain in the model. Once the model is optimized, the procedure ends as indicated by end block 114.

The model resulting from the procedure outlined in FIG. 1 provides a representation of the behavior of the system and assists in determining whether and where specific out-of-spec conditions can occur, as will now be described in more detail with reference to FIG. 5.

Figure 5:
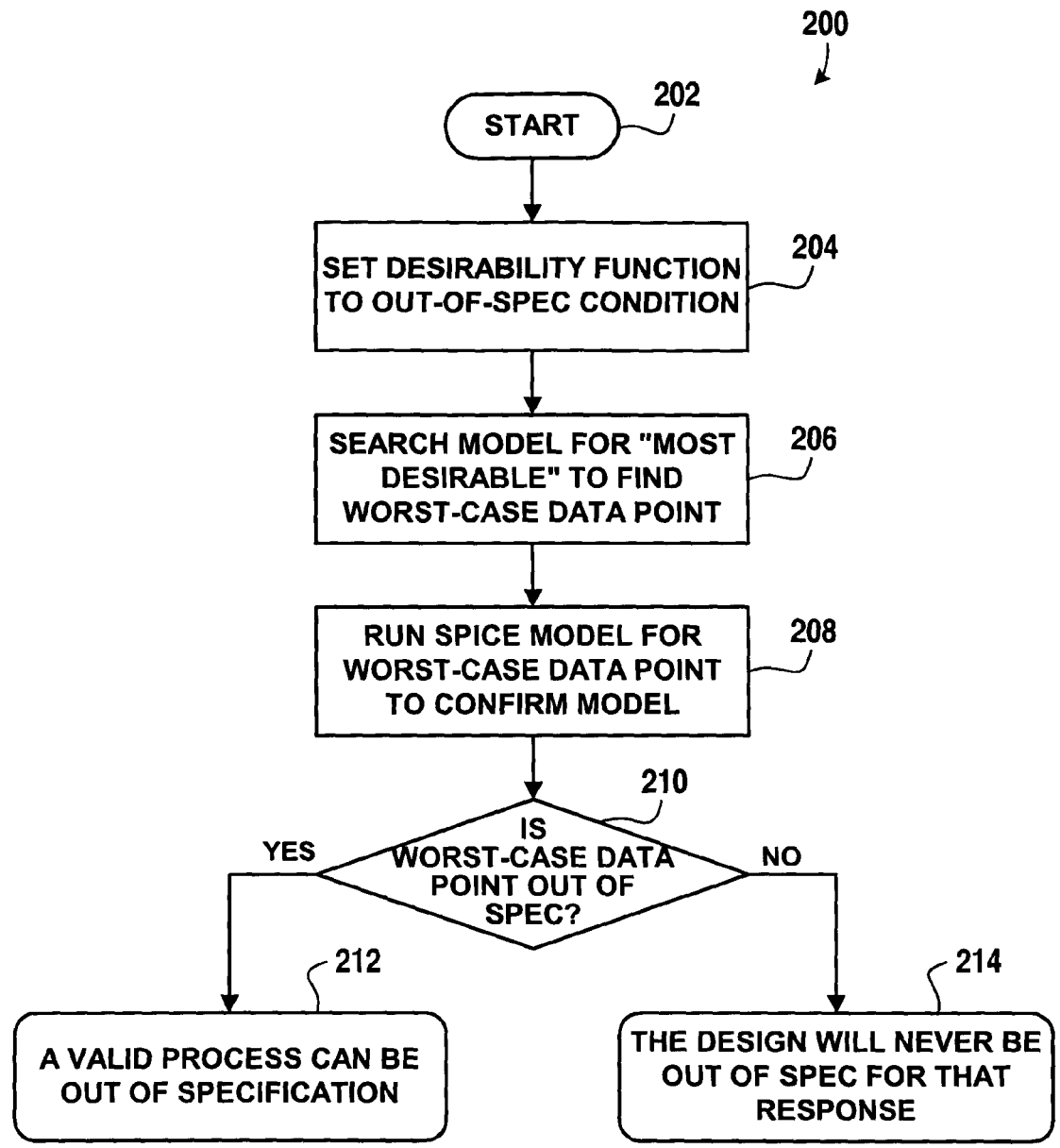
FIG. 5 shows a flowchart depicting a procedure for identifying input conditions that result in specification window violations.
Figure 6:
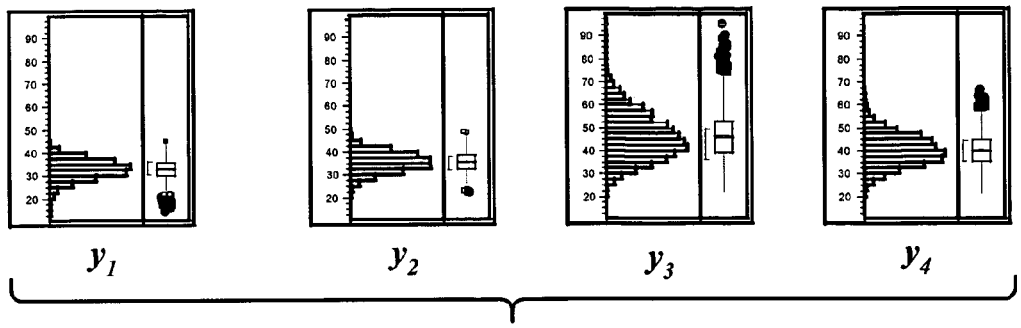
FIG. 6 shows histograms for responses $y_1$ through $y_4$, identifying input conditions leading to specific failures.
Figure 8:
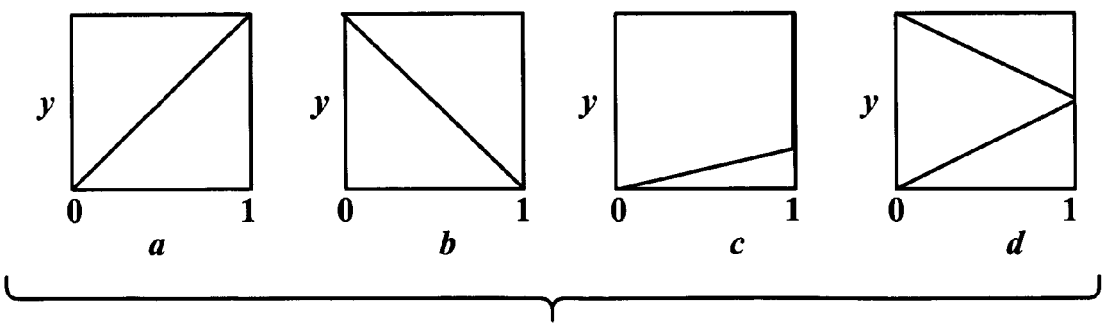
FIG. 8 shows exemplary desirability functions.

FIG. 5 shows a flowchart 200 depicting a procedure for identifying whether and how a specification window can be violated. A specification window is the acceptable range of characteristics resulting from the design. The procedure starts as indicated by start block 202 and proceeds to operation 204 wherein a desirability function is set to a particular out-of-spec condition. When analyzing SPICE outputs and/or the model, response outputs may be considered individually, in groups, and as whole. FIG. 6 shows histograms for responses $y_1$ through $y_4$, identifying input conditions leading to specific failures. For a specific out-of-spec condition identified by the failures, a desirability model can be setup for the particular out-of-spec condition. In this example, $y_1$ and $y_2$ fail low, and $y_3$ and $y_4$ fail high, as shown by the histograms. FIG. 8 shows exemplary desirability functions. A desirability function can be set for y1 and y2 being low, e.g., function b in FIG. 8, and for y3 and y4 being high, e.g., function a in FIG. 8. Other desirability functions can be identified as well, e.g., function c of FIG. 8 indicates any value above a specific threshold as being desirable while function d identifies a particular target value as being desirable. When identifying an out-of-spec condition as being desirable, it is typical that the desirability function identifies a low or a high value.

Figure 7:
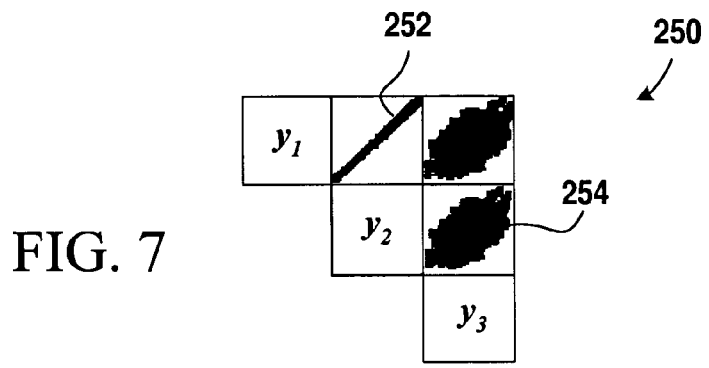
FIG. 7 shows a partial scatterplot grid showing correlations between responses $y_1$, $y_2$, and $y_3$.

When analyzing responses in groups, a scatterplot grid diagram is often used to identify relations between different responses. FIG. 7 shows a partial scatterplot grid 250 showing correlations between responses $y_1$, $y_2$, and $y_3$. As indicated by scatterplot 252, responses $y_1$ and $y_2$ are highly positively correlated, which is to say that as $y_1$ increases, $y_2$ tends to increase. It is therefore essentially impossible for $y_1$ to be high while $y_2$ is low and vice versa. In contrast, $y_2$ and $y_3$ are not highly correlated, as indicated by scatterplot 254. By identifying responses that are highly correlated, groups of responses can be identified rather than individual responses, which reduces the overall number of responses that need to be considered and therefore saves time.

Figure 9:
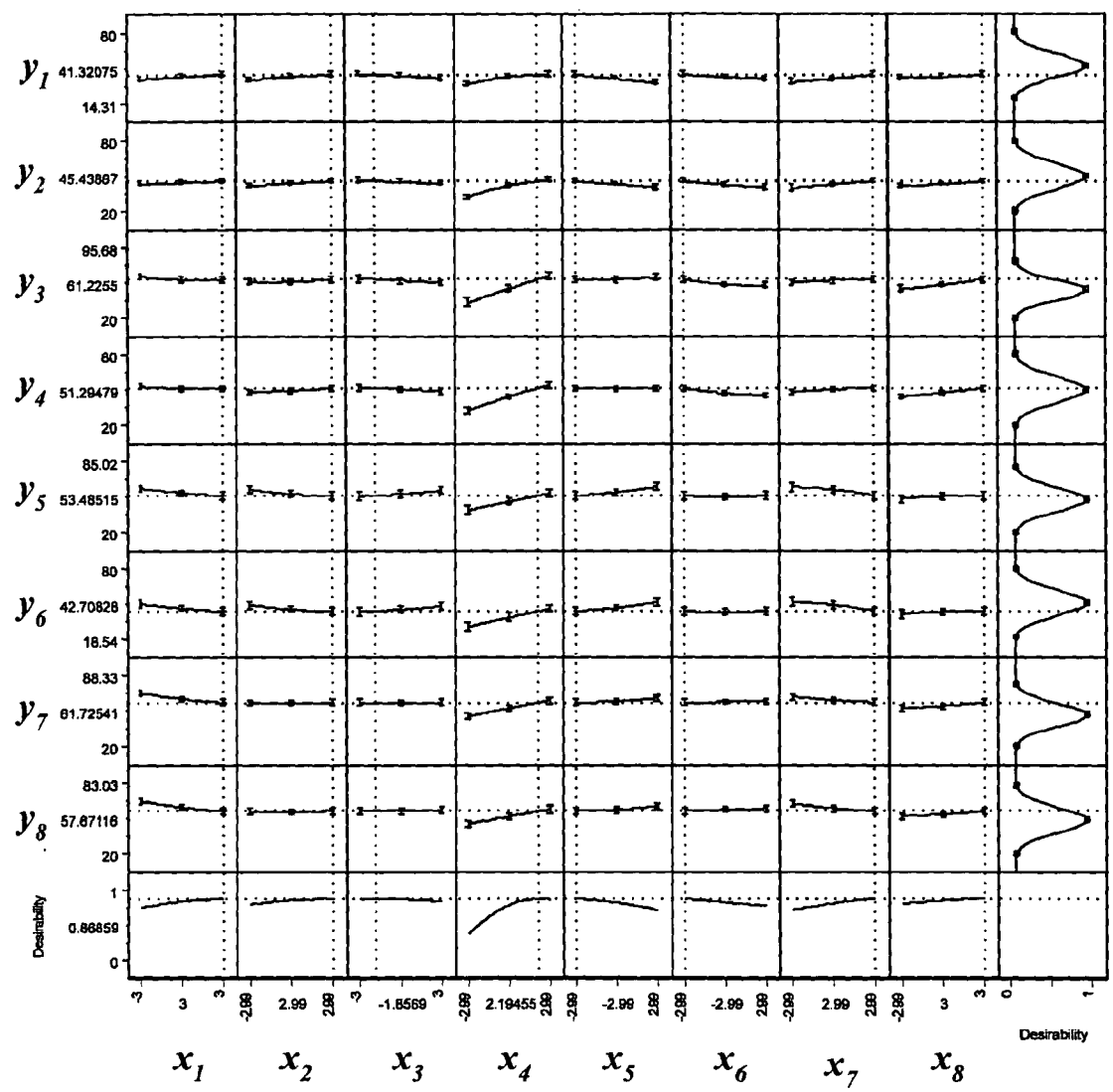
FIG. 9 is a prediction profiler for 8 responses $y_1$-$y_8$ considered simultaneously, plotted against 8 different input conditions $x_1$-$x_8$.

Statistical analysis software packages may allow for all the responses to be considered simultaneously. FIG. 9 is a prediction profiler for 8 responses $y_1$-$y_8$ considered simultaneously, plotted against 8 different input conditions $x_1$-$x_8$. In this diagram, a flat profile indicates no sensitivity to changes in a particular input when the others are held constant. The steeper the curve, the more sensitive the response is to random process fluctuations about the design point. As the selected design point is changed, the sensitivities will change. In the exemplary graph, there is particular sensitivity to response $x_4$. Similar analysis may be performed ignoring particular inputs, such as voltage and temperature.

The above methods for identifying potential out-of-spec conditions are exemplary, and other methods not presented here may be used, such as are available and appropriate for a particular design.

Returning to FIG. 5, after the desirability function is set to an out-of-spec condition, the procedure flows to operation 206 wherein the model is searched for "most desirable" condition. Since the desirability model is set to an out-of-spec condition, the "most desirable" condition is the out-of-spec condition. The search is performed automatically by the statistical software package, such as JMP. The software searches the mathematical model to find the worst-case data point. The worst-case point may be in spec or out-of-spec. After the worst-case data point is discovered, the procedure flows to operation 208.

In operation 208, a SPICE run is performed on the worst-case data point to confirm the mathematical model. As mentioned previously, accuracy of the mathematical model may degrade significantly when extrapolation beyond the data set produced by the SPICE outputs. Since there are typically many more corners and faces in the model than the SPICE run could reasonably test, the worst-case data point is likely to be in a corner or on a face that was not tested by SPICE. Therefore, the accuracy of the model may be degraded by having to extrapolate from the original SPICE results. Thus, a SPICE run should be performed at the worst-case data point to confirm the result from the model. After running the SPICE run, the procedure flows to operation 210.

In operation 210, it is determined whether the worst-case data point is out-of-spec. If the worst-case data point is out-of-spec, then it can be concluded that a valid process can be out of spec, as indicated by result block 212. If the worst-case data point is in spec, then it can be concluded that the design will never be out-of-spec for that response, as indicated by result block 214.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as producing, identifying, determining, or comparing.

Any of the operations described herein that form part of the invention may be useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for identifying specification window violations for an integrated circuit, the method comprising:
    generating a pseudo-random sample set of input parameters for the integrated circuit;
    simulating the integrated circuit using the pseudo-random sample set of input parameters to generate an output set;
    fitting a mathematical model to the output set;
    optimizing the mathematical model by identifying areas where the mathematical model does not fit the output set, and re-fitting the mathematical model after removing a least statistically significant term;
    defining a set of desirability functions to an out-of-spec condition, the desirability functions are set based on an analysis of the output set;
    searching the mathematical model using the desirability functions to identify a worst-case data point;
    determining whether the worst-case data point is within specification or out of specification; and
    implementing the worst-case data point for defining an integrated circuit design to be used to make the integrated circuit when the worst-case data point is within specification.

2. The method of claim 1, further comprising confirming the worst-case data point by simulating the integrated circuit using input parameters defined by the worst-case data point.

3. The method of claim 1, wherein generating the pseudo-random sample set of input parameters comprises generating a Latin hypercube sample set, wherein the Latin hypercube sample set has uniform factors.

4. The method of claim 1 wherein the simulating is performed using a SPICE tool.

5. The method of claim 1 wherein the fitting is performed using a second order Taylor series expansion.

6. The method of claim 5 wherein the fitting further comprises optimizing the second order Taylor series expansion by analyzing and reducing residuals.

7. A non-transitory machine readable medium embodying program instructions for identifying specification window violations for an integrated circuit, the machine readable medium comprising:
    program instructions for generating a pseudo-random sample set of input parameters for the integrated circuit;
    program instructions for simulating the integrated circuit using the pseudo-random sample set of input parameters to generate an output set;
    program instructions for fitting a mathematical model to the output set;
    program instructions for identifying areas where the mathematical model does not fit the output set;
    program instructions for re-fitting the mathematical model after removing a least statistically significant term;
    program instructions for searching the model using desirability functions to identify a worst-case data point, the desirability functions are set based on an analysis of the output set;
    program instructions for determining whether the worst-case data point is within specification or out of specification; and
    program instructions for implementing the worst-case data point for defining an integrated circuit design to be used to make the integrated circuit when the worst-case data point is within specification.

8. The machine readable medium of claim 7, further comprising program instructions for confirming whether the worst-case data point is within specification by simulating the integrated circuit using input parameters defined by the worst-case data point.

9. The machine readable medium of claim 7, wherein the program instructions for generating the pseudo-random sample set of input parameters comprises program instructions for generating a Latin hypercube sample set, wherein the Latin hypercube sample set has uniform in factors.

10. The machine readable medium of claim 7, wherein the program instructions for simulating is a SPICE tool.

11. The machine readable medium of claim 7, wherein the program instructions for fitting generate a second order Taylor series expansion.

12. The machine readable medium of claim 11, wherein the program instructions for fitting further comprise program instructions for optimizing the second order Taylor series expansion by analyzing and reducing residuals.

* * * * *